(12) United States Patent
Hatasako et al.

(10) Patent No.: US 11,031,535 B2
(45) Date of Patent: Jun. 8, 2021

(54) THERMOELECTRIC POWER GENERATION SYSTEM (71) Applicant: Yanmar Co., Ltd., Osaka (JP)

(72) Inventors: Yoshika Hatasako, Osaka (JP); Jiro Fukudome, Osaka (JP); Yuichiro Tanaka, Osaka (JP); Shuichi Nakagawa, Osaka (JP)

(73) Assignee: YANMAR POWER TECHNOLOGY CO., LTD., Osaka (JP)

( * ) Notice: Subject to any disclaimer, the term of this patent is extended or adjusted under 35 U.S.C. 154(b) by 142 days.

(21) Appl. No.: 16/344,745

(22) PCT Filed: Sep. 27, 2017

(86) PCT No.: PCT/JP2017/034918
§ 371 (c)(1),
(2) Date: Apr. 24, 2019

(87) PCT Pub. No.: WO2018/079171
PCT Pub. Date: May 3, 2018

(65) Prior Publication Data
US 2019/0331425 A1 Oct. 31, 2019

(30) Foreign Application Priority Data
Oct. 25, 2016 (JP) .............................. JP2016-208955

(51) Int. Cl.
H01L 35/30 (2006.01)
H01L 23/46 (2006.01)
(Continued)

(52) U.S. Cl.
CPC ................ H01L 35/30 (2013.01); F28D 1/02 (2013.01); F28D 15/02 (2013.01); H01L 23/46 (2013.01); F01N 5/025 (2013.01)

(58) Field of Classification Search
CPC ...... F01N 5/025; F01N 2240/12; F25B 21/02; F28D 1/02; F28D 15/02; H01L 23/46; H01L 35/30; H01L 35/32; H02N 11/00
See application file for complete search history.

(56) References Cited

U.S. PATENT DOCUMENTS 4,125,122 A * 11/1978 Stachurski .............. H01L 35/30
136/205
2004/0076214 A1* 4/2004 Bell ........................ H01L 35/30
374/13
(Continued)

FOREIGN PATENT DOCUMENTS

JP 2004-343898 A 12/2004
JP 2011-176131 A 9/2011
(Continued)

OTHER PUBLICATIONS

International Search Report dated Dec. 12, 2017 issued in corresponding PCT Application PCT/JP2017/034918.

Primary Examiner — Eric S Ruppert
Assistant Examiner — Hans R Weiland
(74) Attorney, Agent, or Firm — Norton Rose Fulbright US LLP (57) ABSTRACT A thermoelectric power generation system including a plurality of thermoelectric power generation devices. Each of the thermoelectric power generation devices includes: a heating unit having a heat medium passage in which a heat medium flows; a cooling unit having a cooling liquid passage in which a cooling liquid flows; a thermoelectric element having the heating unit and the cooling unit so as to generate power by utilizing a temperature difference between a condensation temperature of the heat medium and a temperature of the cooling liquid; and a heat transfer pipe communicated with the heat medium passage to form a circulation path in which the heat medium circulates. The (Continued)

heat transfer pipes of the respective thermoelectric power generation devices are arranged in a single flow path in which a high temperature fluid flows. The heat medium passages of the thermoelectric power generation devices are structured to communicate with each other.

9 Claims, 9 Drawing Sheets

(51) Int. Cl.
  *F28D 15/02* (2006.01)
  *F28D 1/02* (2006.01)
  *F01N 5/02* (2006.01)

(56) References Cited

U.S. PATENT DOCUMENTS

| | | | |
|---|---|---|---|
| 2009/0151920 A1* | 6/2009 | Polcyn | H01L 35/30 |
| | | | 165/185 |
| 2010/0024859 A1* | 2/2010 | Bell | H01L 35/30 |
| | | | 136/201 |
| 2013/0019598 A1* | 1/2013 | Tamaura | H01L 35/30 |
| | | | 60/641.8 |
| 2013/0199591 A1* | 8/2013 | Khan | H01L 35/30 |
| | | | 136/206 |
| 2015/0068575 A1 | 3/2015 | Komitsu | |
| 2017/0342889 A1* | 11/2017 | Fukudome | H01L 35/32 |

FOREIGN PATENT DOCUMENTS

| | | |
|---|---|---|
| JP | 2011-530270 A | 12/2011 |
| WO | 2013/114428 A1 | 8/2013 |
| WO | 2016/098679 A1 | 6/2016 |

\* cited by examiner

THERMOELECTRIC POWER GENERATION SYSTEM

CROSS REFERENCES TO RELATED APPLICATIONS

This application is a national stage application pursuant to 35 U.S.C. § 371 of International Application No. PCT/JP2017/034918, filed on Sep. 27, 2017, which claims priority under 35 U.S.C. § 119 to Japanese Patent Application No. 2016-208955, filed on Oct. 25, 2016, the disclosures of which are hereby incorporated by reference in their entireties

TECHNICAL FIELD

The present invention relates to a thermoelectric power generation system including a plurality of thermoelectric power generation devices configured to generate power by utilizing a temperature difference.

BACKGROUND ART

An example of such a type of traditional thermoelectric power generation system is disclosed in Patent Literature 1 (hereinafter referred to as PTL 1). PTL 1 discloses a thermoelectric power generation system having a plurality of thermoelectric power generation devices arranged around a heat source, the system being configured to vary the distance between the heat source and each of the thermoelectric power generation devices according to changes over time in the temperature of the heat source.

CITATION LIST

Patent Literature

PTL 1: Japanese Patent Application Laid-Open No. 2011-176131

SUMMARY OF INVENTION

Technical Problem

However, the thermoelectric power generation system of PTL 1 still leaves a room for improvement in terms of suppressing and reducing unevenness in the power generation amount among the thermoelectric power generation devices.

To solve the above problem, the present invention provides a thermoelectric power generation system that can suppress or reduce unevenness in the power generation amount among the thermoelectric power generation devices.

Solution to Problem

A thermoelectric power generation system related to an aspect of the present invention is a thermoelectric power generation system including a plurality of thermoelectric power generation devices, wherein each of the thermoelectric power generation devices includes a heating unit having a heat medium passage in which a heat medium flows, a cooling unit having a cooling liquid passage in which a cooling liquid flows, a thermoelectric element having the heating unit on one side and the cooling unit on the other side, the thermoelectric element configured to generate power by utilizing a temperature difference between a condensation temperature of the heat medium that undergoes latent heat transfer in the heat medium passage and a temperature of the cooling liquid, and a heat transfer pipe communicated with the heat medium passage to form a circulation path in which the heat medium is circulated, the heat transfer pipes of the respective thermoelectric power generation devices being arranged in a single flow path in which a high temperature fluid flows, and the heat medium passages of the thermoelectric power generation devices being structured to communicate with each other.

A thermoelectric power generation system related to another aspect of the present invention is a thermoelectric power generation system including a plurality of thermoelectric power generation devices, wherein each of the thermoelectric power generation devices includes a heating unit having a heat medium passage in which a heat medium flows, a cooling unit having a cooling liquid passage in which a cooling liquid flows, a thermoelectric element having the heating unit on one side and the cooling unit on another side, the thermoelectric element configured to generate power by utilizing a temperature difference between a condensation temperature of the heat medium that undergoes latent heat transfer in the heat medium passage and a temperature of the cooling liquid, and a heat transfer pipe communicated with the heat medium passage to form a circulation path in which the heat medium is circulated, the heat transfer pipes of the respective thermoelectric power generation devices being arranged in a single flow path in which a high temperature fluid flows, the circulation passages of the respective thermoelectric power generation devices having equal volumes, and an amount of heat medium filling the circulation path of any of the thermoelectric power generation devices whose heat transfer pipe is in a position where a higher quantity of heat is received from the high temperature fluid being smaller than an amount of heat medium filling the circulation path of any of the thermoelectric power generation devices whose heat transfer pipe is in a position where a lower quantity of heat is received from the high temperature fluid.

Advantageous Effects of Invention

As described above, the thermoelectric power generation system of the present invention can suppress or reduce unevenness in the power generation amount among the thermoelectric power generation devices.

DESCRIPTION OF EMBODIMENTS (Findings on which the Present Invention is Based)

The inventors of the present invention have obtained the following findings, as a result of intensive research for suppressing or reducing unevenness in the power generation amount among the thermoelectric power generation devices.

A thermoelectric power generation device has a heating unit having a heat medium passage on one surface of a thermoelectric element and a cooling unit including a coolant passage on another surface of the thermoelectric element, and configured to generate power by utilizing a temperature difference between the heat medium flowing in the heat medium passage and the coolant flowing in the coolant passage. The thermoelectric power generation system of PTL 1 includes a plurality of thermoelectric power generation devices arranged around a heat source, so that the heat source serves as a heating unit shared among the thermoelectric power generation devices. Further, a space between the heat source and each of the thermoelectric power generation devices serve as a heat medium passage, and the air in this space serves as the heat medium.

In the thermoelectric power generation system of PTL 1, each of the thermoelectric power generation devices is brought closer to or farther from the heat source so that the thermoelectric elements of thermoelectric power generation devices receive an even quantity of heat from the heat source. Such a structure however requires that the heat from the heat source be evenly radiated to the thermoelectric elements of the thermoelectric power generation devices. However, due to environmental conditions and the like, the heat from the heat source may not be evenly radiated to the surroundings. In such a case, the quantity of heat received may be different among the thermoelectric power generation devices, which leads to unevenness in the difference in the power generation amount among the thermoelectric power generation devices.

The thermoelectric power generation system of PTL 1 adopts the air as the heat medium, and since the air flowing in the heat medium passage stays in the same phase, the air undergoes sensible heat transfer. In other words, the temperature of the heat medium changes while it flows in the heat medium passage.

Meanwhile, the inventors of the present invention have found that, by causing a phase transition of the heat medium (e.g. from gas to liquid) while the heat medium flows in the heat medium passage, the temperature of the heat medium can be constant and unevenness in the power generation amount among the thermoelectric power generation devices can be suppressed or reduced. That is, during latent heat transfer of the heat medium, the condensation temperature of the heat medium is constant. By utilizing this, the temperature of the heat medium in the thermoelectric power generation devices can be made constant even when the quantity of heat received from the heat source varies among the thermoelectric power generation devices. As a result, unevenness in the power generation amount among the thermoelectric power generation devices can be suppressed or reduced.

Further, the inventors of the present invention have found that unevenness in the quantity of heat received by the thermoelectric power generation devices can be suppressed or reduced and unevenness in the power generation amount among the thermoelectric power generation devices can be suppressed or reduced, by providing each of the thermoelectric power generation devices with a heat transfer pipe communicating to the heat medium passage, and arranging the respective heat transfer pipes in a single flow path in which a high temperature fluid flows.

Based on these findings, the inventors of the present invention have arrived at the following invention.

A thermoelectric power generation system related to an aspect of the present invention is a thermoelectric power generation system including a plurality of thermoelectric power generation devices, wherein each of the thermoelectric power generation devices includes a heating unit having a heat medium passage in which a heat medium flows, a cooling unit having a cooling liquid passage in which a cooling liquid flows, a thermoelectric element having the heating unit on one side and the cooling unit on another side, the thermoelectric element configured to generate power by utilizing a temperature difference between a condensation temperature of the heat medium that undergoes latent heat transfer in the heat medium passage and a temperature of the cooling liquid, and a heat transfer pipe communicated with the heat medium passage to form a circulation path in which the heat medium is circulated, the heat transfer pipes of the respective thermoelectric power generation devices being arranged in a single flow path in which a high temperature fluid flows, the heat medium passages of the thermoelectric power generation devices being structured to communicate with each other.

In this structure, each of the thermoelectric power generation devices generates power by utilizing the condensation temperature of the heat medium that undergoes latent heat transfer in the heat medium passage. Therefore, unevenness in the power generation amount among the thermoelectric power generation devices can be suppressed or reduced. Further, unevenness in the quantity of heat received by the thermoelectric power generation devices can be suppressed or reduced and unevenness in the power generation amount among the thermoelectric power generation devices can be suppressed or reduced by providing each of the thermoelectric power generation devices with a heat transfer pipe communicating to the heat medium passage, and arranging the respective heat transfer pipes in a single passage in which a high temperature fluid flows. Further, since the heat medium passages of the thermoelectric power generation devices are in communication with one another, unevenness in the power generation amount among the thermoelectric power generation devices can be further suppressed or reduced.

It should be noted that the heat medium passages of the thermoelectric power generation devices may be communicated with one another through a pressure equalizer so that the pressure inside the heat medium passage is equalized.

With this structure, unevenness in the power generation amount among the thermoelectric power generation devices can be further suppressed or reduced by equalizing the pressure in the heat medium passage of the thermoelectric power generation devices.

It should be noted that the pressure equalizer is a member that equalizes the pressure inside the heat medium passages of the thermoelectric power generation devices, and does not necessarily have to be a member in which the heat medium flows. Therefore, a maximum cross section of the pressure equalizer perpendicularly crossing the direction in which the pressure equalizer extends may be smaller than a minimum cross section of the heat medium passage perpendicularly crossing the direction in which the heat medium passage extends.

A thermoelectric power generation system related to another aspect of the present invention is a thermoelectric power generation system including a plurality of thermoelectric power generation devices, wherein each of the thermoelectric power generation devices includes a heating unit having a heat medium passage in which a heat medium flows, a cooling unit having a cooling liquid passage in which a cooling liquid flows, a thermoelectric element having the heating unit on one side and the cooling unit on another side, the thermoelectric element configured to generate power by utilizing a temperature difference between a condensation temperature of the heat medium that undergoes latent heat transfer in the heat medium passage and a temperature of the cooling liquid, and a heat transfer pipe communicated with the heat medium passage to form a circulation path in which the heat medium is circulated, the heat transfer pipes of the respective thermoelectric power generation devices being arranged in a single flow path in which a high temperature fluid flows, the circulation passages of the respective thermoelectric power generation devices having equal volumes, an amount of heat medium filling the circulation path of any of the thermoelectric power generation devices whose heat transfer pipe is in a position where a higher quantity of heat is received from the high temperature fluid being smaller than an amount of heat medium filling the circulation path of any of the thermoelectric power generation devices whose heat transfer pipe is in a position where a lower quantity of heat is received from the high temperature fluid.

In this structure, each of the thermoelectric power generation devices generates power by utilizing the condensation temperature of the heat medium that undergoes latent heat transfer in the heat medium passage. Therefore, unevenness in the power generation amount among the thermoelectric power generation devices can be suppressed or reduced. Further, unevenness in the quantity of heat received by the thermoelectric power generation devices can be suppressed or reduced and unevenness in the power generation amount among the thermoelectric power generation devices can be suppressed or reduced by providing each of the thermoelectric power generation devices with a heat transfer pipe communicating to the heat medium passage, and arranging the respective heat transfer pipes in a single passage in which a high temperature fluid flows. Further, since an amount of heat medium filling each thermoelectric power generation device is varied according to the quantity of heat received from the high temperature fluid, the pressure inside the heat medium passages of the thermoelectric power generation devices can be equalized, and unevenness in the power generation amount among the thermoelectric power generation devices can be further suppressed and reduced.

The heat transfer pipe and the heat medium passage may be connected through an attaching part, and the attaching part may have a bent portion bent in such a manner that the heating unit, the cooling unit, and the thermoelectric element extend in a direction along the wall surface of a flow path.

With this structure, the space taken by the thermoelectric power generation system can be reduced.

A thermoelectric power generation device related to another aspect of the present invention includes:

a heating unit having a heat medium passage in which a heat medium flows;

a cooling unit having a cooling liquid passage in which a cooling liquid flows;

a thermoelectric element having the heating unit on one side and the cooling unit on another side, the thermoelectric element configured to generate power by utilizing a temperature difference between a condensation temperature of the heat medium that undergoes latent heat transfer in the heat medium passage and a temperature of the cooling liquid; and a heat transfer pipe communicated with the heat medium passage to form a circulation path in which the heat medium is circulated, wherein the heat transfer pipe is arranged in a flow path in which a high temperature fluid flows, and the heat transfer pipe and the heat medium passage are connected through an attaching part.

This structure can improve the degree of freedom in connecting the heat transfer pipe and the heat medium passage.

It should be noted that the attaching part may have a flange part attached in such a manner as to close an opening portion provided on the wall surface of the flow path, the opening portion allowing the heat transfer pipe to pass therethrough.

With this structure, for example, the heat transfer pipe can be easily arranged in the flow path by inserting the heat transfer pipe in an opening portion provided on the wall surface of the flow path, and the opening portion can be closed by the flange part. Thus, the thermoelectric power generation device can be easily attached to the wall surface of the flow path.

Further, the attaching part may have a detachable communication pipe which communicates the heat transfer pipe and the heat medium passage.

In this structure with the detachable communication pipe, for example, a communication pipe with a suitable length according to the thickness of the wall of the flow path, the thickness of the insulating material formed on the wall surface of the flow path, or the like can be used. Therefore, the degree of freedom in the place of installing the thermoelectric power generation device can be improved.

Further, the attaching part may have a bent portion bent in such a manner that the heating unit, the cooling unit, and the thermoelectric element extend in a direction along the wall surface of the flow path.

With this structure, the space of the thermoelectric power generation device can be saved.

The following describes embodiments with reference to attached drawings. In each of the drawings, elements are exaggerated for the sake of easier understanding.

Embodiment 1

A thermoelectric power generation system related to Embodiment 1 includes a plurality of thermoelectric power generation devices. First, the following describes the thermoelectric power generation devices.

[Thermoelectric Power Generation Device]

Figure 1A:
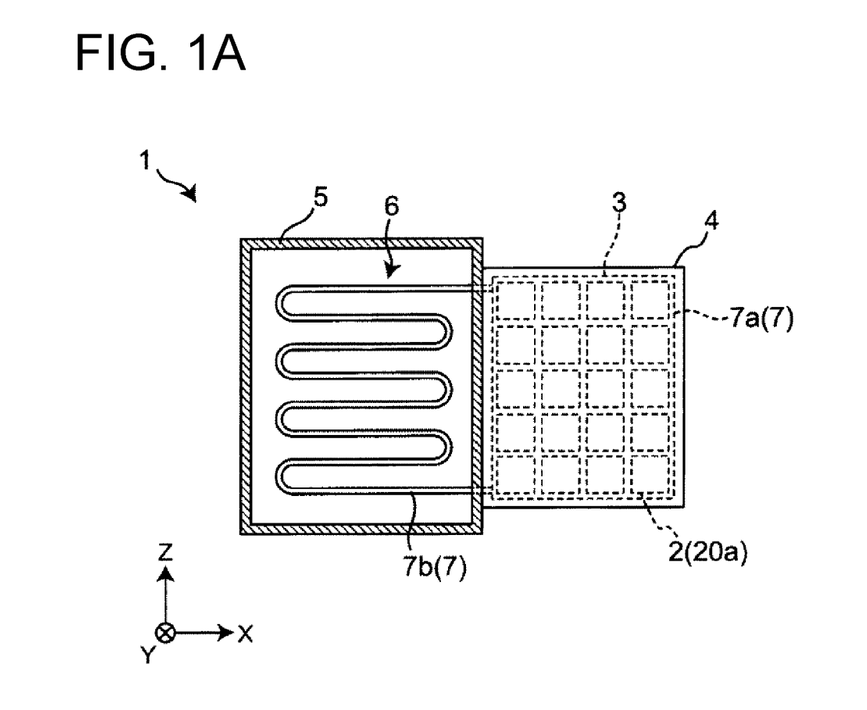
FIG. 1A A diagram showing a schematic structure of a thermoelectric power generation device included in a thermoelectric power generation system related to Embodiment 1 of the present invention.
Figure 1B:
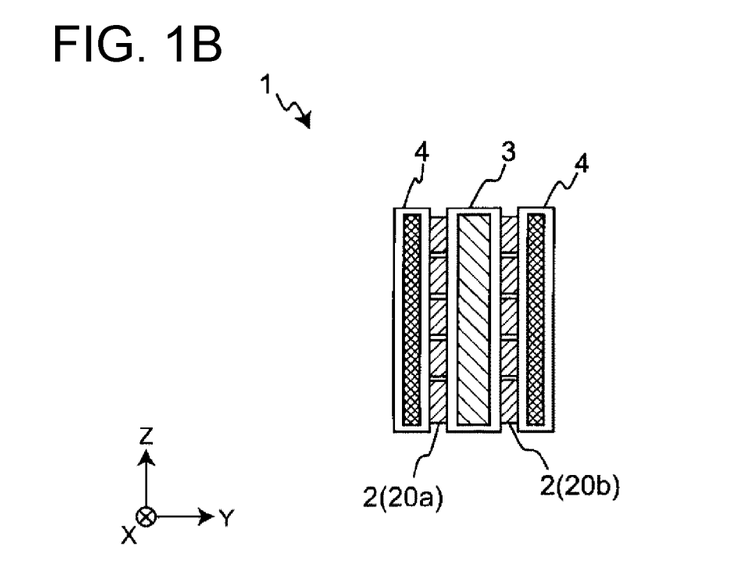
FIG. 1B A diagram showing a schematic structure of a thermoelectric power generation device included in a thermoelectric power generation system related to Embodiment 1 of the present invention, as viewed from the back.

FIG. 1A shows a schematic structure of a thermoelectric power generation device 1 related to Embodiment 1. The directions X, Y, and Z in FIG. 1A indicate the longitudinal direction, lateral direction, and the height direction of the thermoelectric power generation device 1, respectively. The longitudinal direction, the lateral direction, and the height direction mean the length direction, short direction, and the up-down direction of the thermoelectric power generation device 1, respectively. FIG. 1B is a diagram showing a schematic structure of the thermoelectric power generation device 1 as viewed from behind (in X direction).

As shown in FIG. 1A and FIG. 1B, the thermoelectric power generation device 1 includes a thermoelectric element 2 in which a heating unit 3 is provided on one surface and a cooling unit 4 is provided on the other surface. In Embodiment 1, the thermoelectric elements 2 are provided on both sides of the heating unit 3, and the cooling units 4 are provided on both sides of the heating unit 3 so as to face each other across the thermoelectric elements 2. In Embodiment 1, the heating unit 3 is connected to a heat transfer pipe 6 arranged in a flow path 5 in which a high temperature fluid flows.

<Thermoelectric Element>

The thermoelectric element 2 is an element having two surfaces, i.e., one surface on which the heating unit 3 is provided (the high-temperature side) and the other surface on which the cooling unit 4 is provided (on the low-temperature side). In the thermoelectric element 2, the heating unit 3 heats the one surface and the cooling unit 4 cools the other surface, thereby generating power using the temperature difference. The thickness of the thermoelectric element 2 is designed to be smaller than the size (width) of the first side and the second side of the thermoelectric element 2. Specifically, the thermoelectric element 2 is formed in a plate shape. In Embodiment 1, thermoelectric modules 20a and 20b each having a plurality of serially connected thermoelectric elements 2 are attached to both sides of the heating unit 3. Specifically, on both sides of the heating unit 3, the thermoelectric modules 20a, 20b each having 20 thermoelectric elements 2 of four columns×five rows are attached. The number of thermoelectric elements 2 is not limited to this. For example, the thermoelectric power generation device 1 may have one thermoelectric element 2 attached to each of both sides of the heating unit 3.

<Heating Unit>

The heating unit 3 is made of a metal material with excellent thermal conductivity. The heating unit 3 is formed in a plate shape, which contacts first sides of the thermoelectric elements 2. The heating unit 3 is connected to the heat transfer pipe 6. The heating unit 3 and the heat transfer pipe 6 have internal spaces 7a, 7b communicating with each other. In the internal space 7a of the heating unit 3 and the internal space 7b of the heat transfer pipe 6, a heat medium is enclosed. Further, the internal space 7a of the heating unit 3 and the internal space 7b of the heat transfer pipe 6 form a circulation path 7 in which the heat medium is circulated. That is, the heat transfer pipe 6 communicates with the heat medium passage to form a circulation path 7 in which heat medium is circulated.

The heat transfer pipe 6 is arranged in the flow path 5 and vaporizes the heat medium flowing in the internal space 7b which is a part of the circulation path 7, by using the heat of the high temperature fluid flowing in the flow path 5. That is, the heat transfer pipe 6 functions as a vaporizing unit for vaporizing the heat medium. The heating unit 3 condenses the heat medium vaporized in the internal space 7b of the heat transfer pipe 6. That is, the heating unit 3 functions as a condensing unit for condensing the heat medium. In Embodiment 1, water is used as the heat medium. Further, the flow path 5 is, for example, an engine duct of an exhaust gas through which a high-temperature exhaust gas flows. In the flow path 5, the high temperature fluid flows in a direction towards the paper surface of FIG. 1A, i.e., in the Y direction.

Figure 2:
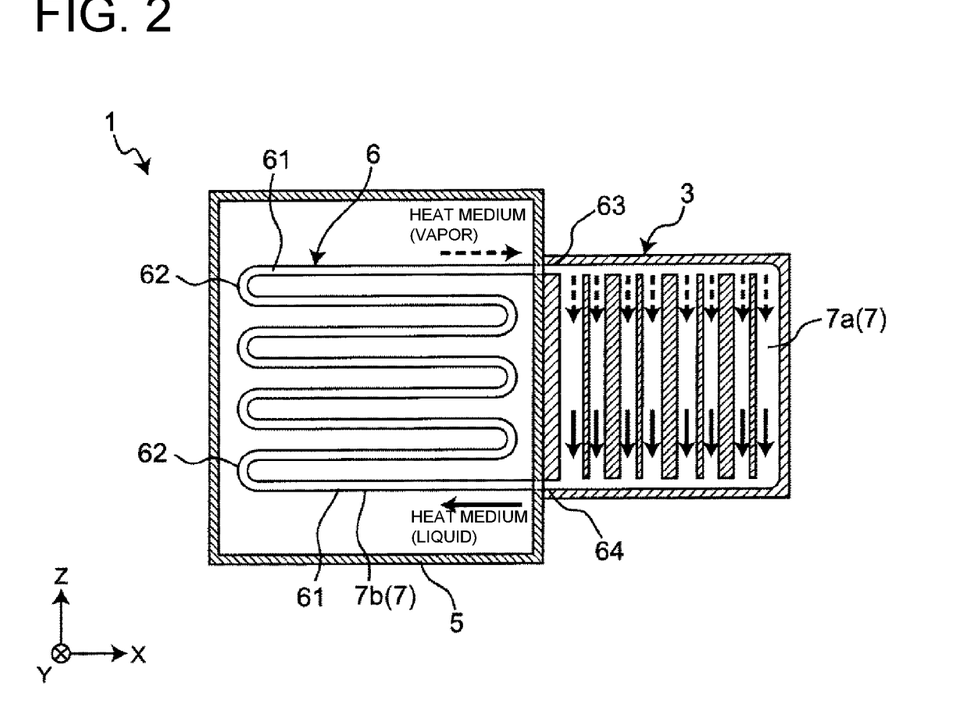
FIG. 2 A diagram showing a schematic structure of a heating unit of a thermoelectric power generation device included in a thermoelectric power generation system related to Embodiment 1 of the present invention.

FIG. 2 shows a schematic structure of the heating unit 3 and the heat transfer pipe 6 of the thermoelectric power generation device 1. As shown in FIG. 2, the heat transfer pipe 6 is structured so as to have a large contact area with the high temperature fluid flowing in the flow path 5, when viewed in the direction in which the high temperature fluid flows, i.e., the Y direction. Specifically, the heat transfer pipe 6 has a plurality of tubular members 61 extending in the X direction and a plurality of bent portions 62 connecting the tubular members 61 to each other, as viewed from the Y direction. The plurality of tubular members 61 are arranged with a predetermined interval in the Z direction and their end portions are connected through the bent portions 62, when viewed in the Y direction. With the plurality of tubular members 61 connected through the bent portions 62 as described, the heat transfer pipe 6 forms a continuous pipe having a plurality of bent portions.

In the internal space 7a of the heating unit 3, a heat medium passage in which the heat medium flows is formed. In Embodiment 1, the heat medium passage is formed so that the heat medium spreads throughout the entire heating surface of the thermoelectric element 2. Specifically, as shown in FIG. 2, a plurality of heat medium passages extending in the Z direction are formed in the internal space 7a of the heating unit 3. The heat medium passages in the internal space 7a of the heating unit 3 may be, for example, inclined towards the X direction, as long as the heat medium flows in the direction of gravity.

<Circulation Path>

The circulation path 7 is formed through the internal space 7a of the heating unit 3 and the internal space 7b of the heat transfer pipe 6. The heat medium circulates in the internal space 7a of the heating unit 3 and the internal space 7b of the heat transfer pipe 6. Specifically, when the heat transfer pipe 6 is heated by the high temperature fluid flowing in the flow path 5, the liquid heat medium flowing in the heat transfer pipe 6 is turned into vapor. In other words, the heat medium is vaporized in the internal space 7b of the heat transfer pipe 6 and the phase of the heat medium changes from liquid to gas. The vapor is discharged from an opening end portion 63 in a high position of the heat transfer pipe 6 to the heat medium passage in the internal space 7a of the heating unit 3. The vapor discharged into the heat medium passage in the internal space 7a of the heating unit 3 falls in the direction of gravity while being poured onto the heating surface of the heating unit 3, and is condensed by radiating heat from the heating surface to heat the thermoelectric elements 2. In other words, the phase of the heat medium changes from gas to liquid in the internal space 7a of the heating unit 3. That is, the heat medium undergoes latent heat transfer, and the condensation temperature of the heat medium is constant. The heat medium condensed flows from an open end portion 64 in a low position of the heat transfer pipe 6 into the heat medium passage in the internal space 7b of the heat transfer pipe 6. The heat medium having flowed into the internal space 7b of the heat transfer pipe 6 is again heated by the high temperature fluid flowing into the flow path 5, and the phase of the heat medium is changed from liquid to gas. As described, the heat medium spontaneously circulates in the circulation path 7 formed by the internal space 7a of the heating unit 3 and the internal space 7b of the heat transfer pipe 6. In other words, by using the phase change of the heat medium, the heat medium is repeatedly circulated in the circulation path 7 formed by the internal space 7a of the heating unit 3 and the internal space 7b of the heat transfer pipe 6, without power of a pump and the like.

<Cooling Unit>

Figure 3:
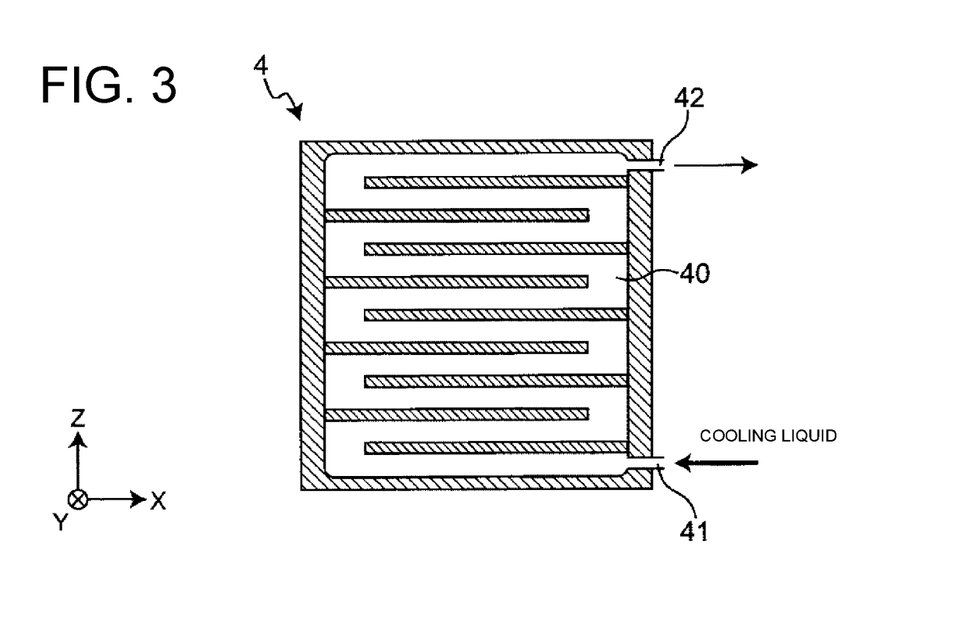
FIG. 3 A diagram showing a schematic structure of a cooling unit of a thermoelectric power generation device included in a thermoelectric power generation system related to Embodiment 1 of the present invention.

The cooling units 4 are each made of a metal material with excellent thermal conductivity. The cooling units 4 are formed in a plate shape, which contact the second sides of the thermoelectric elements 2. Further, inside each of the cooling units 4, a cooling liquid passage in which a cooling liquid flows is formed.

FIG. 3 shows a schematic structure of the cooling unit 4 of the thermoelectric power generation device 1. As shown in FIG. 3, inside the cooling unit 4, a plate-shape cooling liquid passage 40 is formed in such a manner that the cooling liquid is spread throughout the entire cooling surface of the cooling unit 4 which contacts the thermoelectric element 2. Specifically, the cooling liquid passage 40 has a plurality of passages extending in the X direction, which are connected with one another. The cooling liquid passage 40 is provided with a cooling liquid inflow pipe 41 on its low side, and a cooling liquid discharge pipe 42 on its high side. The cooling liquid having flowed from the cooling liquid inflow pipe 41 into the cooling liquid passage 40 cools the cooling surface in contact with the second side of the thermoelectric element 2, and then discharged from the cooling liquid discharge pipe 42. Although the cooling liquid passage 40 in Embodiment 1 is formed in a plate shape such that the cooling liquid spreads throughout the entire cooling surface in contact with the thermoelectric element 2, the shape of the cooling liquid passage 40 is not limited as long as the second side of the thermoelectric element 2 is entirely and evenly cooled. Further, the plurality of passages of the cooling liquid passage 40 inside the cooling unit 4 may extend not only in the X direction but also in the Z direction. In Embodiment 1, water is used as the cooling liquid.

[Thermoelectric Power Generation System]

A thermoelectric power generation system related to Embodiment 1 is described.

Figure 4:
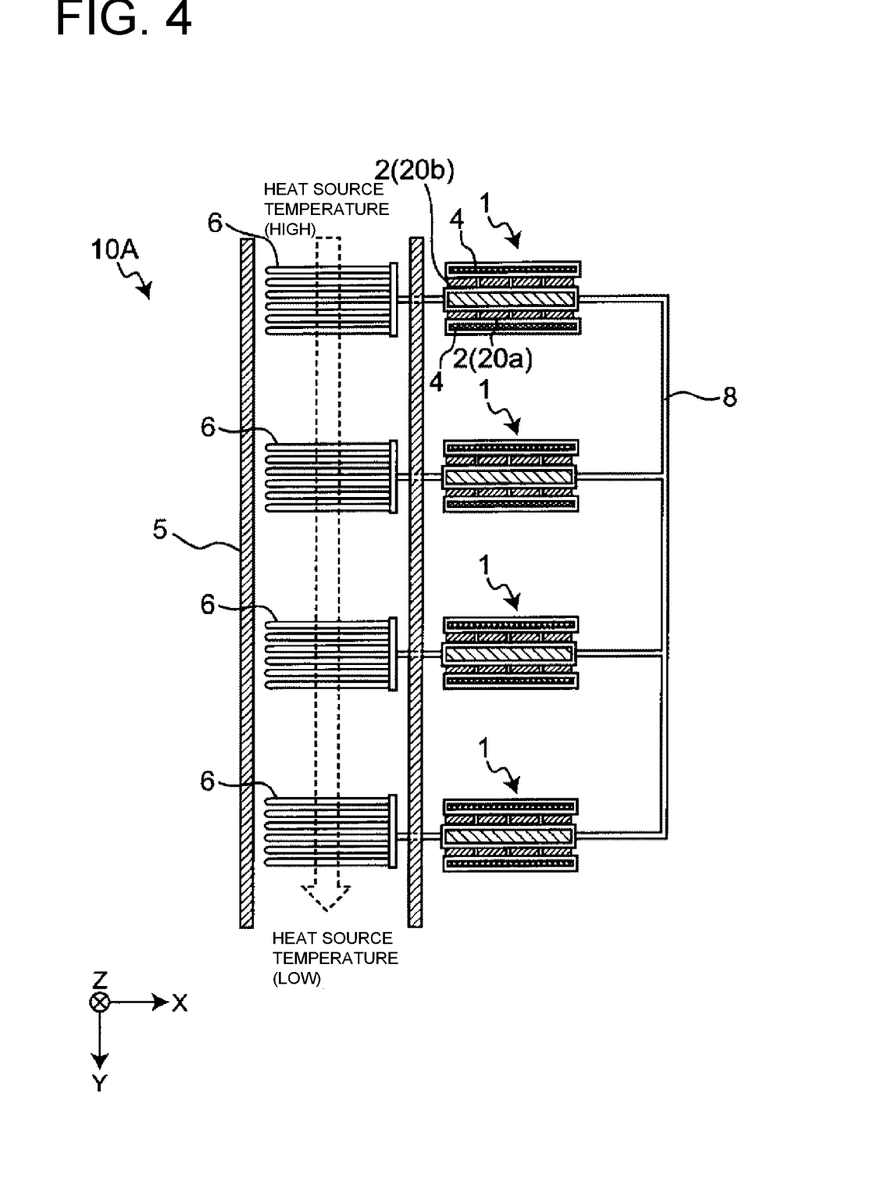
FIG. 4 A diagram showing a schematic structure of the thermoelectric power generation system related to Embodiment 1 of the present invention as viewed in a height direction.

FIG. 4 is a diagram showing a schematic structure of the thermoelectric power generation system 10A related to Embodiment 1 as viewed in a height direction. As shown in FIG. 4, the thermoelectric power generation system 10A includes four thermoelectric power generation devices 1. Heat transfer pipes 6 of the thermoelectric power generation device 1 are arranged in a single flow path 5 in which a high temperature fluid flows. The heat medium passages of the thermoelectric power generation devices 1 are communicated with one another. Specifically, the heat medium passages of the thermoelectric power generation devices 1 are communicated with one another by a pressure equalizer 8 in such a manner that the pressures in the heat medium passages are equalized.

<Electric System>

Figure 5:
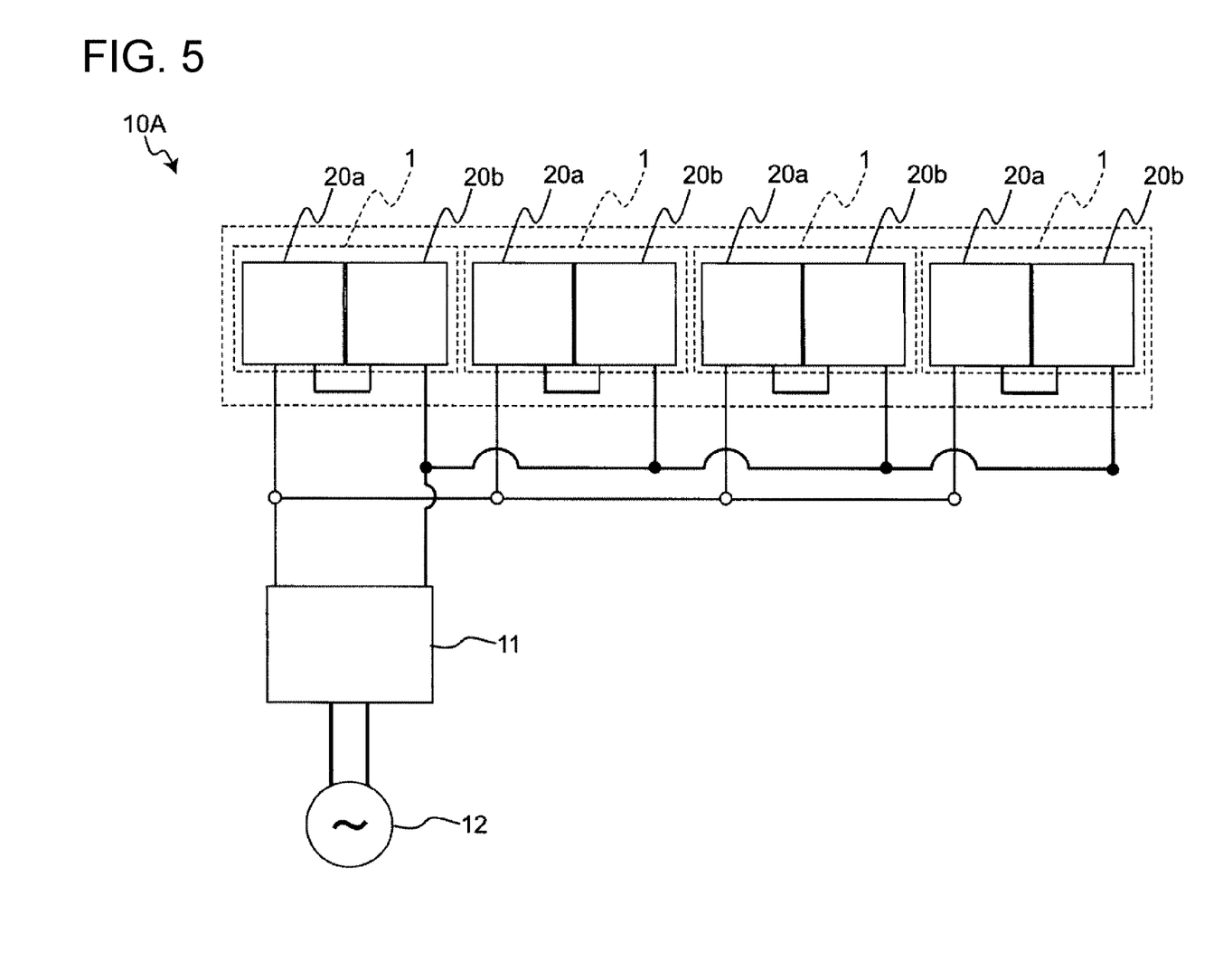
FIG. 5 A schematic diagram of the thermoelectric power generation system using the thermoelectric power generation device related to Embodiment 1 of the present invention.

FIG. 5 is a schematic diagram of an electric system of a thermoelectric power generation system 10A. As shown in FIG. 5, the thermoelectric power generation system 10A includes: four thermoelectric power generation devices 1, an inverter 11, and an electric load 12. In the thermoelectric power generation system 10A, the four thermoelectric power generation devices 1 are connected in parallel. The four thermoelectric power generation devices 1 connected in parallel are connected to the inverter 11. The inverter 11 is connected to the electric load 12. In the thermoelectric power generation system 10A, power generated by the four thermoelectric power generation devices 1 is supplied to the electric load 12 through the inverter 11.

<Heat Medium System>

Figure 6:
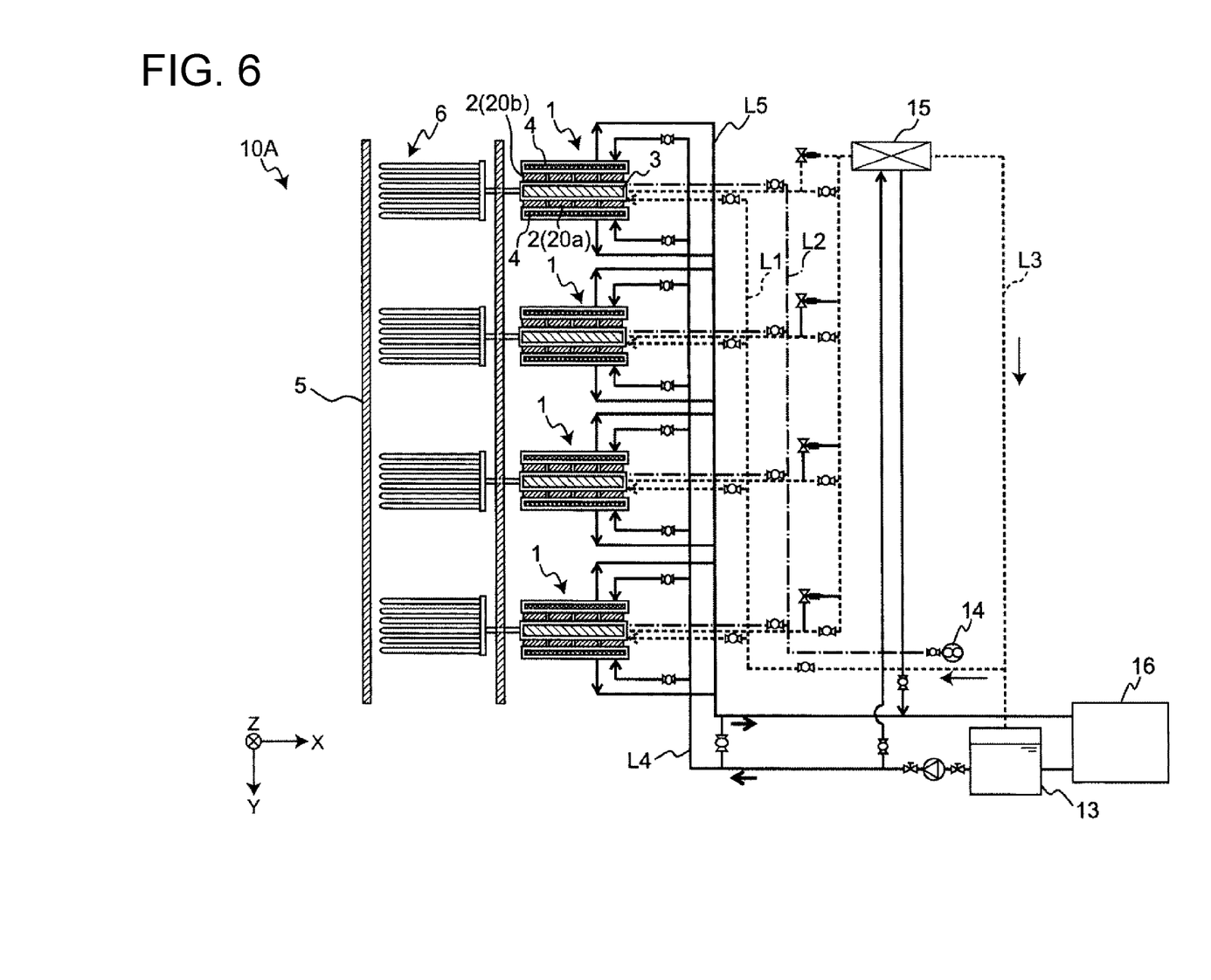
FIG. 6 A schematic diagram of a heat medium system of the thermoelectric power generation system related to Embodiment 1 of the present invention.

FIG. 6 is a schematic diagram of a heat medium system of a thermoelectric power generation system 10A. In FIG. 6, the dotted line and the one dot chain line indicate the line of the heat medium, and the solid line indicates the line of the cooling liquid. First, a flow of the heat medium is described. As shown in FIG. 6, the heat medium lines L 1, L 2, and L 3 are connected to the heating unit 3 of the thermoelectric power generation device 1. To the heat medium lines L1, L2, and L3, valves are provided respectively. While the heat medium spontaneously circulates inside the heating unit 3, the heat medium lines L1, L2, L3 are closed. The valve provided to the heat medium line L3 is a pressure valve.

The heat medium line L1 is a line for loading water to become the heat medium. To supply the heat medium inside the heating unit 3, the valve of the heat medium line L1 is opened to supply the heat medium from a tank 13 into the heating unit 3, through the heat medium line L1.

The heat medium line L2 is a line for evacuation using a vacuum pump 14. Evacuation is performed by using the vacuum pump 14 through the heat medium line L2, while the heating unit 3 has no heat medium. After the evacuation, the heat medium in the tank 13 is supplied inside the heating unit 3 through the heat medium line L1.

The heat medium line L3 is a line for discharging the heat medium inside the heating unit 3 to the tank 13. When the vapor pressure inside the heating unit 3 becomes higher than the tolerance of the pressure valve of the heat medium line L3, the pressure valve opens and the vapor inside the heating unit 3 is discharged to the heat medium line L3. The heat medium discharged from the heating unit 3 flows in the heat medium line L3, and is discharged to the tank 13 through a heat exchanger 15. Since water is used as the heat medium and as the cooling liquid in Embodiment 1, the cooling liquid and the heat medium can be stored in the tank 13.

Next, a flow of the cooling liquid is described. As shown in FIG. 6, the cooling liquid flows from the tank 13 to the cooling unit 4 through a cooling liquid line L4, with the use of a pump and the like. The cooling liquid having flowed into the cooling unit 4 flows to a cooling installation 16 through a cooling liquid line L5. The cooling installation 16 is, for example, a cooling tower for cooling the cooling liquid. The cooling liquid cooled in the cooling installation 16 is stored in the tank 13.

[Effects]

The thermoelectric power generation system 10A related to Embodiment 1 brings about the following effects.

In the thermoelectric power generation system 10A, each of the thermoelectric power generation devices 1 generates power by utilizing the condensation temperature of the heat medium that undergoes latent heat transfer in the heat medium passage. Therefore, unevenness in the power generation amount among the thermoelectric power generation devices 1 can be suppressed or reduced. Further, unevenness in the quantity of heat received by the thermoelectric power generation devices 1 can be suppressed or reduced and unevenness in the power generation amount among the thermoelectric power generation devices 1 can be suppressed or reduced by providing each of the thermoelectric power generation devices 1 with a heat transfer pipe 6 communicating to the heat medium passage, and arranging the respective heat transfer pipes 6 in a single flow path 5 in which a high temperature fluid flows.

In Embodiment 1, the high temperature fluid flows within the flow path 5 in the direction indicated by the broken line arrow. In this case, the heat of the high temperature fluid is taken away by the heat transfer pipes 6 and the like as it flows from the upstream to the downstream of the flow direction, and the temperature of the high temperature fluid therefore is decreased. Therefore, the quantity of heat received by the heat transfer pipe 6 arranged in the downstream of the flow direction of the high temperature fluid is smaller than the quantity of heat received by the heat transfer pipe 6 arranged upstream of the flow direction of the high temperature fluid.

In the thermoelectric power generation system 10A on the other hand, since the heat medium passages of the thermoelectric power generation devices 1 are in communication with one another, unevenness in the power generation amount among the thermoelectric power generation devices 1 can be further suppressed or reduced. Further, in the thermoelectric power generation system 10A, the heat medium passages of the thermoelectric power generation devices 1 are communicated with one another by a pressure equalizer 8 in such a manner that the pressures in the heat medium passages are equalized. With this structure, unevenness in the power generation amount among the thermoelectric power generation devices 1 can be further suppressed or reduced by equalizing the pressure in the heat medium passage of the thermoelectric power generation devices 1.

Further, in the thermoelectric power generation system 10A, each of the thermoelectric power generation devices 1 can be made identical, and therefore the mass productivity can be improved by modularizing the device.

It should be noted that the pressure equalizer 8 is a member that equalizes the pressures inside the heat medium passages of the thermoelectric power generation devices 1, and is not a path for circulating the heat medium. Therefore, a maximum cross section of the pressure equalizer 8 perpendicularly crossing the direction in which the pressure equalizer 8 extends may be smaller than a minimum cross section of the heat medium passage perpendicularly crossing the direction in which the heat medium passage extends. Further, a position of connecting the pressure equalizer 8 to each of the thermoelectric power generation devices 1 is not particularly limited; however, the position is preferably where the heat medium having turned into liquid after condensed in the heat medium passage does not flow in.

It should be noted that Embodiment 1 deals with a thermoelectric power generation system 10A having four thermoelectric power generation devices 1A; however, the present invention is not limited to this, as long as the thermoelectric power generation system 10A includes at least one thermoelectric power generation device 1.

Although Embodiment 1 adopts water as the heat medium and the cooling liquid, the present invention is not limited to this. The heat medium and the cooling liquid may be different. Any heat medium may be adopted provided that the heat medium can change its phase between gas and liquid in the circulation path 7. Any given liquid may be adopted as a cooling liquid, provided that cooling is possible.

Although Embodiment 1 deals with a case where the thermoelectric element 2 is provided to one side of the heating unit 3, the present invention is not limited to this. For example, the thermoelectric element 2 may be provided on a surface of only one side of the heating unit 3.

Embodiment 2

[Overall Structure]

A thermoelectric power generation system related to Embodiment 2 of the present invention is described. It should be noted that Embodiment 2 mainly describes differences from Embodiment 1. In Embodiment 2, the same symbols are given to structures identical or similar to those of Embodiment 1. Further, the description of Embodiment 2 omits descriptions which overlaps with that of Embodiment 1.

Figure 7:
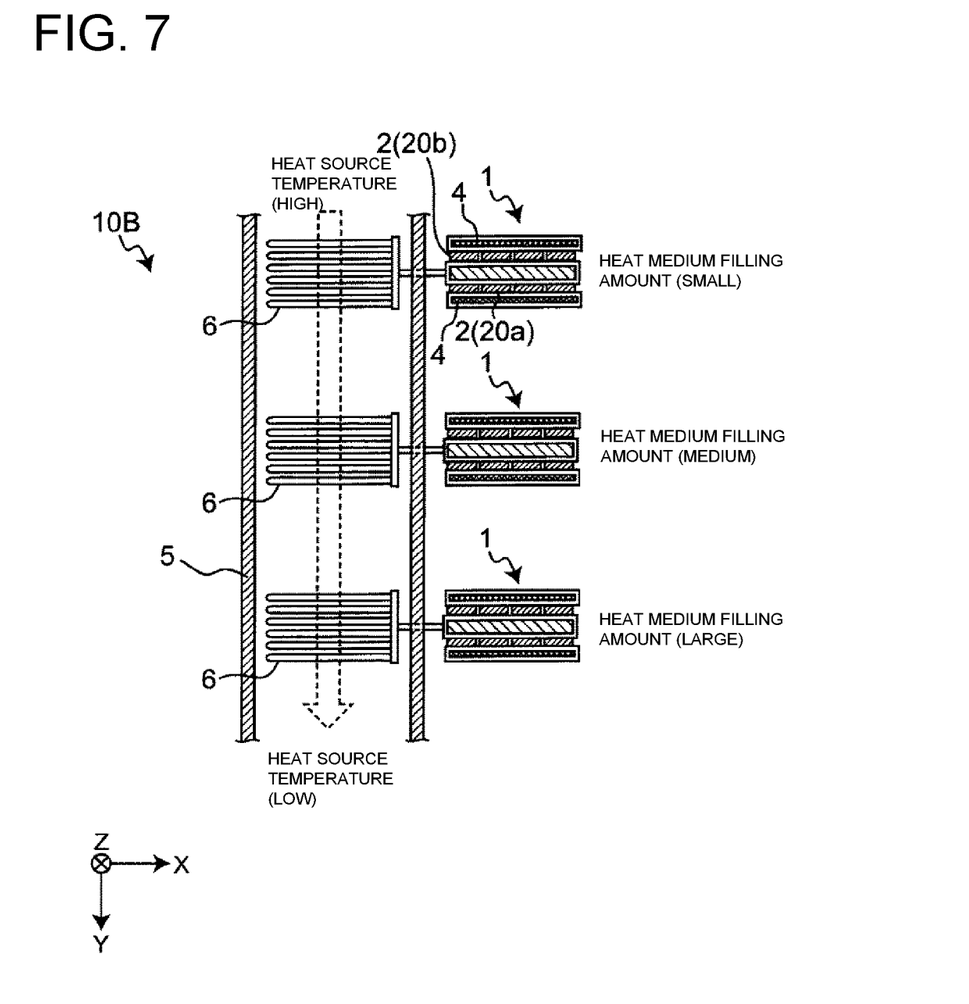
FIG. 7 A diagram showing a schematic structure of a thermoelectric power generation device related to Embodiment 2 of the present invention, as viewed in a height direction.

FIG. 7 shows a schematic structure of a thermoelectric power generation system 10B related to Embodiment 2.

Embodiment 2 is different from Embodiment 1 in that the thermoelectric power generation system 10B includes three thermoelectric power generation devices 1 and that the system is configured to change the amount of heat medium filling each of the thermoelectric power generation devices 1 according to the quantity of heat received from the high temperature fluid.

Specifically, an amount of heat medium filling a thermoelectric power generation device 1 whose heat transfer pipe 6 is arranged in a position where a higher quantity of heat is received from the high temperature fluid is smaller than an amount of heat medium filling a thermoelectric power generation device 1 whose heat transfer pipe 6 is arranged in a position where a lower quantity of heat is received from the high temperature fluid. Therefore, the amount of heat medium filling the circulation passage 7 (see FIG. 2) is the smallest in the thermoelectric power generation device 1 whose heat transfer pipe 6 is in the upstream position of the flow direction of the high temperature fluid. Further, the amount of heat medium filling the circulation passage 7 (see FIG. 2) is the largest in the thermoelectric power generation device 1 whose heat transfer pipe 6 is in the downstream position of the flow direction of the high temperature fluid. It should be noted that the circulation passages of the respective thermoelectric power generation devices 1 have equal volumes. For example, in order from the thermoelectric power generation device 1 positioned upstream of the flow direction of the high temperature fluid, the amount of heat medium filling each of the thermoelectric power generation devices 1 are 10%, 15%, and 20% of the total fillable amount, respectively.

[Effects]

The thermoelectric power generation system 10B related to Embodiment 2 brings about the following effects.

In the thermoelectric power generation system 10B, each of the thermoelectric power generation devices 1 generates power by utilizing the condensation temperature of the heat medium that undergoes latent heat transfer in the heat medium passage. Therefore, unevenness in the power generation amount among the thermoelectric power generation devices can be suppressed or reduced. Further, unevenness in the quantity of heat received by the thermoelectric power generation devices 1 can be suppressed or reduced and unevenness in the power generation amount among the thermoelectric power generation devices 1 can be suppressed or reduced by providing each of the thermoelectric power generation devices 1 with a heat transfer pipe 6 communicating to the heat medium passage, and arranging the respective heat transfer pipes 6 in a single flow path 5 in which a high temperature fluid flows. Further, since an amount of heat medium filling each thermoelectric power generation device 1 is varied according to the quantity of heat received from the high temperature fluid, the pressure inside the heat medium passages of the thermoelectric power generation devices 1 can be equalized, and unevenness in the power generation amount among the thermoelectric power generation devices 1 can be further suppressed and reduced.

Further, in the thermoelectric power generation system 10B, each of the thermoelectric power generation devices 1 can be made identical, and therefore the mass productivity can be improved by modularizing the device.

Figure 8:
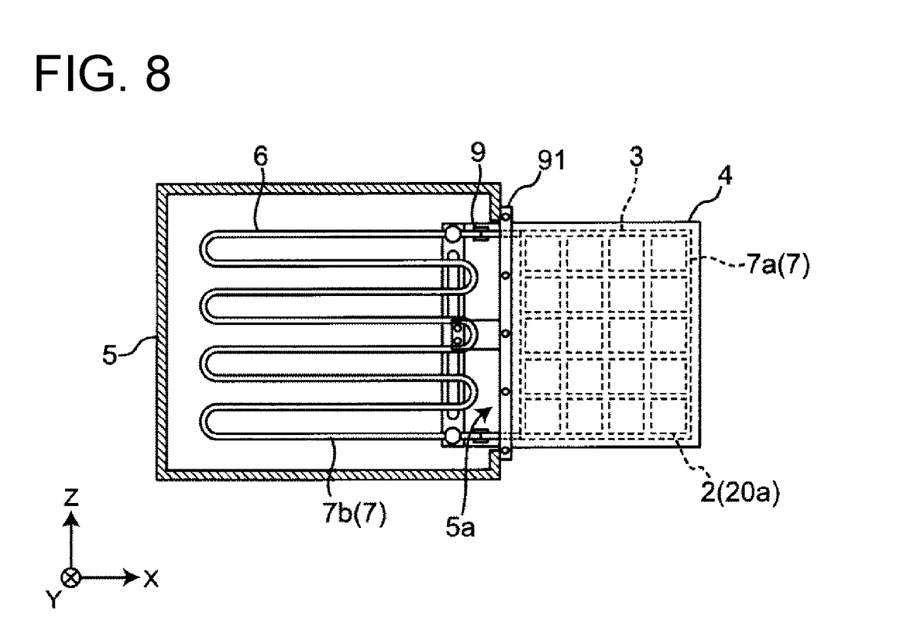
FIG. 8 A diagram showing a schematic structure of a modification of a thermoelectric power generation device connecting a heat transfer pipe and a heat medium passage through an attaching part.
Figure 9:
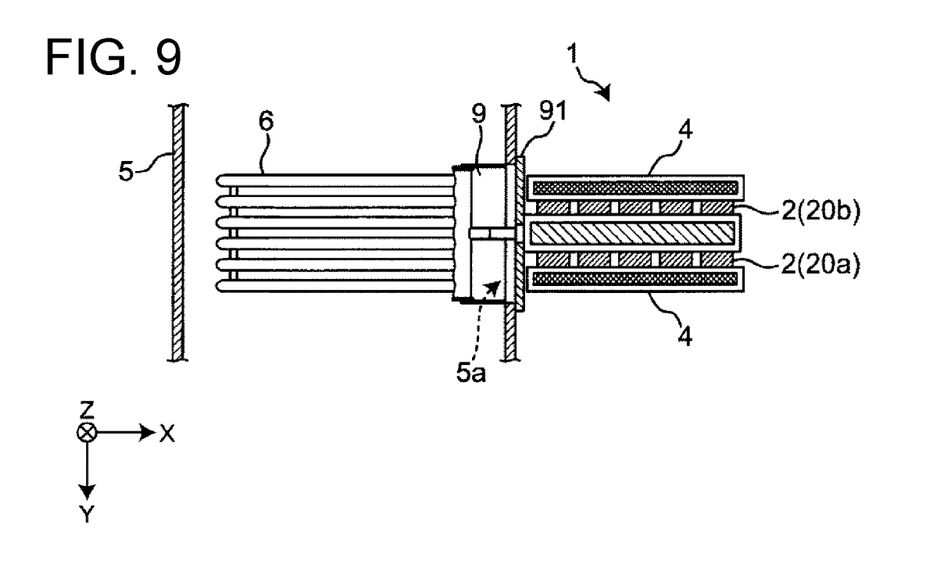
FIG. 9 A diagram showing a schematic structure of a modification of a thermoelectric power generation device connecting a heat transfer pipe and a heat medium passage through an attaching part, as viewed in a height direction.

It should be noted that the present invention is not limited to the embodiment described above but may be embodied in many different forms. For example, although the above embodiments deal with a case where the heat transfer pipe 6 and the heat medium passage in the internal space 7a of the heating unit 3 are directly connected, the present invention is not limited to this. For example, as shown in FIG. 8 and FIG. 9, the heat transfer pipe 6 and the heat medium passage may be connected through an attaching part 9. With this structure, the degree of freedom in connecting the heat transfer pipe 6 and the heat medium passage can be improved.

Further, as shown in FIG. 8 and FIG. 9, the attaching part 9 may have a flange part 91 attached in such a manner as to close an opening portion 5a provided on the wall surface of the flow path 5, the opening portion allowing the heat transfer pipe 6 to pass therethrough. With this structure, for example, the heat transfer pipe 6 can be easily arranged in the flow path 5 by inserting the heat transfer pipe 6 in the opening portion 5a provided on the wall surface of the flow path 5, and the opening portion 5a can be closed by the flange part 91. Thus, the thermoelectric power generation device 1 can be easily attached to the wall surface of the flow path 5. The opening portion 5a may be any given form as long as it allows the heat transfer pipe 6 to be inserted into the flow path 5. For example, a slit and the like can be adopted. The wall surface of the flow path 5 is, for example, the wall surface of a cylindrical exhaust gas duct forming the flow path 5.

Figure 10:
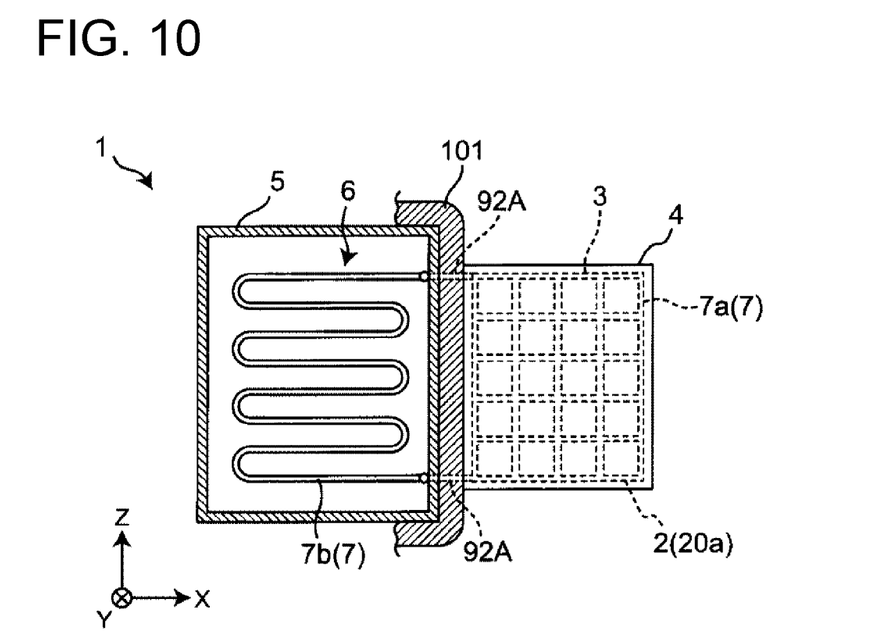
FIG. 10 A diagram showing a schematic structure of a modification of a thermoelectric power generation device connecting a heat transfer pipe and a heat medium passage through a detachable communication pipe.
Figure 11:
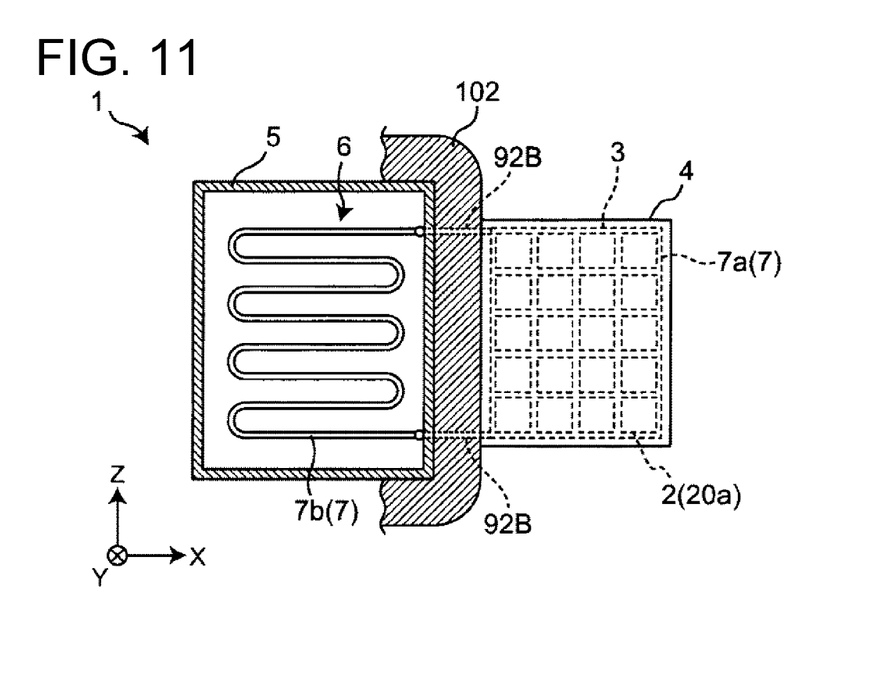
FIG. 11 A diagram showing a schematic structure of a modification of a thermoelectric power generation device connecting a heat transfer pipe and a heat medium passage through a detachable communication pipe.

Further, As shown in FIG. 10 and FIG. 11, the attaching part 9 may have a detachable communication pipe 92A, 92B which communicates the heat transfer pipe 6 and the heat medium passage. In this structure with the detachable communication pipe 92A, 92B, for example, the communication pipe 92A, 92B having a suitable length according to the thickness of the wall of the flow path 5, the thickness of the insulating material 101, 102 formed on the wall surface of the flow path 5, or the like can be used. Therefore, the degree of freedom in the place of installing the thermoelectric power generation device can be improved.

Figure 12:
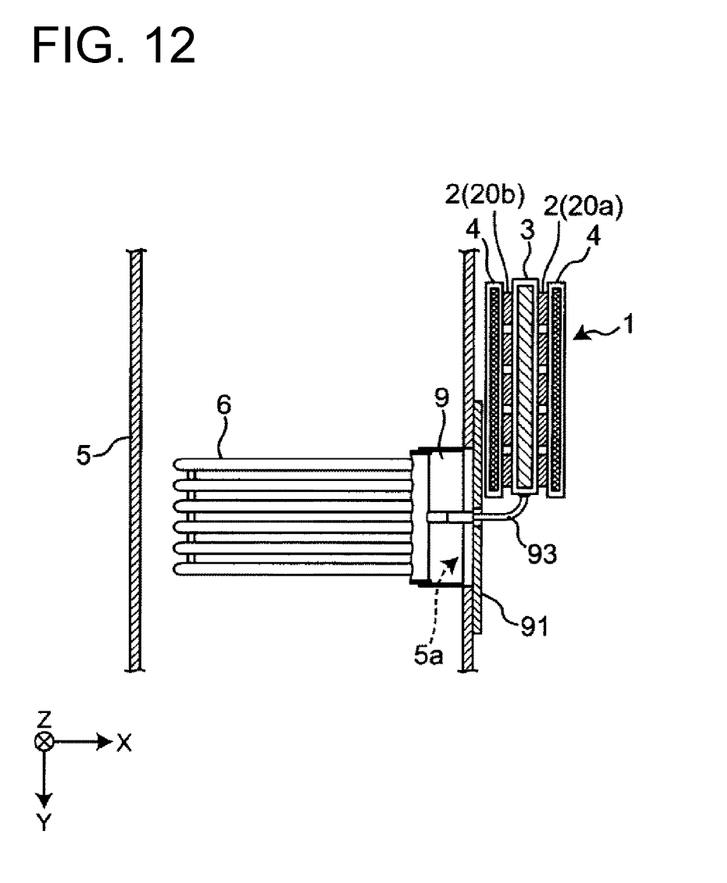
FIG. 12 A diagram showing a schematic structure of a modification of a thermoelectric power generation device with an attaching part having a bent portion bent in such a manner that the heating unit, the cooling unit, and the thermoelectric element extend along a wall surface of a flow path.

Further, as shown in FIG. 12, the attaching part 9 may have a bent portion 93 bent in such a manner that the heating unit 3, the cooling unit 4, and the thermoelectric element 2 extend in a direction along the wall surface of the flow path 5. With this structure, the space taken by the thermoelectric power generation device 1 can be reduced.

It should be noted that the effects of the embodiments described above can be brought about by suitably combining any of the various embodiments described above.

Although each of the above embodiments describes the present invention with a certain level of details, the details of the structures disclosed in these embodiments are modifiable. Further, modification in combinations and arrangement of elements in each embodiment are possible without departing from the scope and spirit of the present disclosure.

INDUSTRIAL APPLICABILITY

Since unevenness in the power generation amount among the thermoelectric power generation devices can be suppressed or reduced, the present invention is useful for a thermoelectric power generation system having a plurality of thermoelectric power generation devices each configured to generate power by utilizing heat of a high temperature fluid flowing in a passage such as an exhaust gas duct of an engine.

REFERENCE SIGNS LIST 1 thermoelectric power generation device
10A, 10B thermoelectric power generation system
11 inverter
12 electric load
13 tank
14 vacuum pump
15 heat exchanger
16 cooling installation
2 thermoelectric element
20a, 20b thermoelectric module 3 heating unit
4 cooling unit
40 cooling liquid passage
41 cooling liquid inflow pipe
42 cooling liquid discharge pipe
5 flow path
5a opening portion
6 heat transfer pipe
61 tubular member
62 bent portion
63, 64 open end portion
7 circulation path
7a, 7b internal space
8 pressure equalizer
9 attaching part
91
92A, 92B communication pipe
93 bent portion
101, 102 insulating material
L1, L2, L3 heat medium line
L4, L5 cooling liquid line

The invention claimed is:

1. A thermoelectric power generation system comprising: a plurality of thermoelectric power generation devices, wherein: each of the thermoelectric power generation devices comprises:
   a heating unit having a heat medium passage configured for flow of a heat medium flows, medium, a cooling unit having a cooling liquid passage in which configured for flow of a cooling liquid,
   a thermoelectric element having the heating unit on one side thereof and the cooling unit on another side thereof, the thermoelectric element configured to generate power by utilizing a temperature difference between a condensation temperature of the heat medium that undergoes latent heat transfer in the heat medium passage and a temperature of the cooling liquid, and
   a heat transfer pipe in fluid communication with the heat medium passage to form a circulation path associated with the heat medium, and
   each heat transfer pipe of the plurality of thermoelectric power generation devices is arranged in a single flow path configured for flow of a high temperature fluid,
   each heat medium passage of the plurality of thermoelectric power generation devices is in fluid communication each other heat medium passage of the plurality of thermoelectric power generation devices, and
   each circulation path of the plurality of thermoelectric power generation devices is configured to include an amount of heat medium based on a position of a corresponding heat transfer pipe, the amount of heat medium based on a first position of the corresponding heat transfer pipe less than an amount of heat medium based on a second position of the corresponding heat transfer pipe, the corresponding heat transfer pipe configured to receive more heat in the first position than the second position.

2. The thermoelectric power generation system according to claim 1, wherein the heat medium passages of the thermoelectric power generation devices are configured to be in fluid communication via a pressure equalizer so that the pressure inside the heat medium passage is equalized.

3. The thermoelectric power generation system according to claim 2, wherein a maximum cross section of the pressure equalizer perpendicularly crossing a direction in which the pressure equalizer extends is smaller than a minimum cross section of the heat medium passage perpendicularly crossing a direction in which the heat medium passage extends.

4. A thermoelectric power generation system comprising: a plurality of thermoelectric power generation devices, wherein:
   each of the thermoelectric power generation devices comprises:
   a heating unit having a heat medium passage configured for flow of a heat medium,
   a cooling unit having a cooling liquid passage configured for flow of a cooling liquid,
   a thermoelectric element having the heating unit on one side and the cooling unit on another side, the thermoelectric element configured to generate power by utilizing a temperature difference between a condensation temperature of the heat medium that undergoes latent heat transfer in the heat medium passage and a temperature of the cooling liquid, and
   a heat transfer pipe in fluid communication with the heat medium passage to form a circulation path associated with the heat medium, and
   each heat transfer pipe of the plurality of thermoelectric power generation devices is arranged in a single flow path configured to receive a high temperature fluid,
   each circulation path of the plurality of thermoelectric power generation devices has an equal volume, and
   an amount of heat medium filling the circulation path of any of the thermoelectric power generation devices whose heat transfer pipe is in a position where a higher quantity of heat is received from the high temperature fluid is smaller than an amount of heat medium filling the circulation path of any of the thermoelectric power generation devices whose heat transfer pipe is in a position where a lower quantity of heat is received from the high temperature fluid.

5. The thermoelectric power generation system according to claim 1, wherein:
   the heat transfer pipe and the heat medium passage are connected via an attaching part; and
   the attaching part has a bent portion bent in such a manner that the heating unit, the cooling unit, and the thermoelectric element extend in a direction along a wall surface of the flow path.

6. A thermoelectric power generation device of a plurality of thermoelectric power generation devices, the thermoelectric power generation device comprising:
   a heating unit having a heat medium passage configured for flow of a heat medium;
   a cooling unit having a cooling liquid passage configured for flow of a cooling liquid;
   a thermoelectric element having the heating unit on one side and the cooling unit on another side, the thermoelectric element configured to generate power based on a temperature difference between a condensation temperature of the heat medium that undergoes latent heat transfer in the heat medium passage and a temperature of the cooling liquid;
   a heat transfer pipe in fluid communication with the heat medium passage to form a circulation path associated with circulation of the heat medium; and
   wherein:
   the heat transfer pipe is arranged in a flow path configured for flow of a high temperature fluid,
   the heat transfer pipe and the heat medium passage are connected to each other through an attaching part, the circulation path is configured to include an amount of heat medium based on a position of the heat transfer pipe; and the amount of heat medium is based on a first position of the heat transfer pipe relative to a second heat transfer pipe of a second thermoelectric power generation device of the plurality of thermoelectric power generation devices, the second heat transfer pipe in the flow path, and the amount of heat medium in the heat transfer pipe less than a second amount of heat medium in the second heat transfer pipe based on the heat transfer pipe being positioned in the flow path such that the heat transfer pipe receives more heat than the second heat transfer pipe.

7. The thermoelectric power generation device according to claim 6, wherein the attaching part has a flange part attached in such a manner as to close an opening portion provided on a wall surface of the flow path, the opening portion configured to allow the heat transfer pipe to pass therethrough.

8. The thermoelectric power generation device according to claim 6, wherein the attaching part has a detachable communication pipe, the heat transfer pipe and the heat medium passage configured to communicate via the detachable communication pipe.

9. The thermoelectric power generation device according to claim 6, wherein the attaching part has a bent portion bent in such a manner that the heating unit, the cooling unit, and the thermoelectric element extend in a direction along a wall surface of the flow path.

\* \* \* \* \*